(12) United States Patent
Lin

(10) Patent No.: US 12,094,559 B2
(45) Date of Patent: Sep. 17, 2024

(54) NON-VOLATILE MEMORY AND VOLTAGE DETECTING CIRCUIT THEREOF

(71) Applicant: eMemory Technology Inc., Hsin-Chu (TW)

(72) Inventor: Zhe-Yi Lin, Hsinchu County (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 174 days.

(21) Appl. No.: 18/072,014

(22) Filed: Nov. 30, 2022

(65) Prior Publication Data

US 2023/0223051 A1    Jul. 13, 2023

Related U.S. Application Data

(60) Provisional application No. 63/298,202, filed on Jan. 10, 2022.

(51) Int. Cl.
*G11C 5/14* (2006.01)
(52) U.S. Cl.
CPC ................. *G11C 5/148* (2013.01)
(58) Field of Classification Search
CPC .......... G11C 5/148; G11C 5/14; G11C 5/144; G11C 5/147
See application file for complete search history.

(56) References Cited

U.S. PATENT DOCUMENTS

2014/0133240 A1* 5/2014 Chen ................. G11C 16/30
365/185.18
2022/0001817 A1* 1/2022 Sakamoto ............ H02J 7/0063

FOREIGN PATENT DOCUMENTS

TW         I744009 B    10/2021

* cited by examiner

*Primary Examiner* — Han Yang
(74) *Attorney, Agent, or Firm* — WPAT, P.C

(57) ABSTRACT

A voltage detecting circuit for a non-volatile memory is provided. When a standby signal is not asserted, a power supply unit of the non-volatile memory provides an array voltage to a first node. The voltage detecting circuit includes an initial voltage generator, a capacitor, a latch and a combinational logic circuit. The initial voltage generator receives an inverted standby signal and an enable signal. An output terminal of the initial voltage generator is connected with a second node. The capacitor is coupled between the first node and the second node. An input terminal of the latch is connected with the second node. An output terminal of the latch is connected with a third node. An input terminal of the combinational logic circuit is connected with the third node. An output terminal of the combinational logic circuit generates the enable signal.

19 Claims, 6 Drawing Sheets

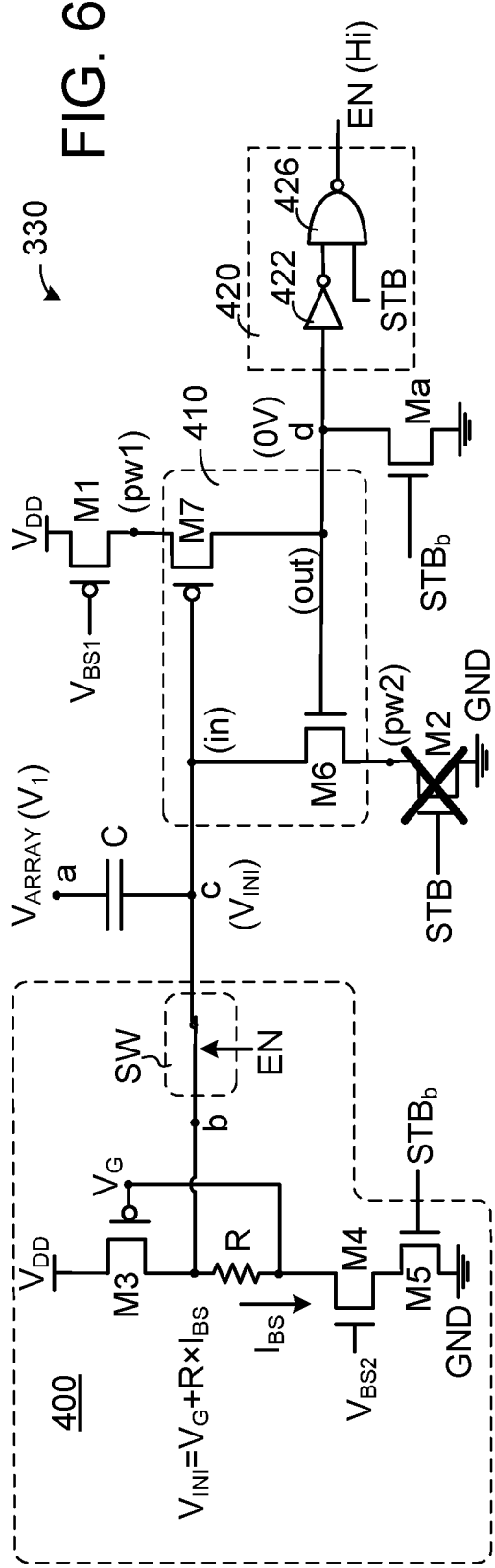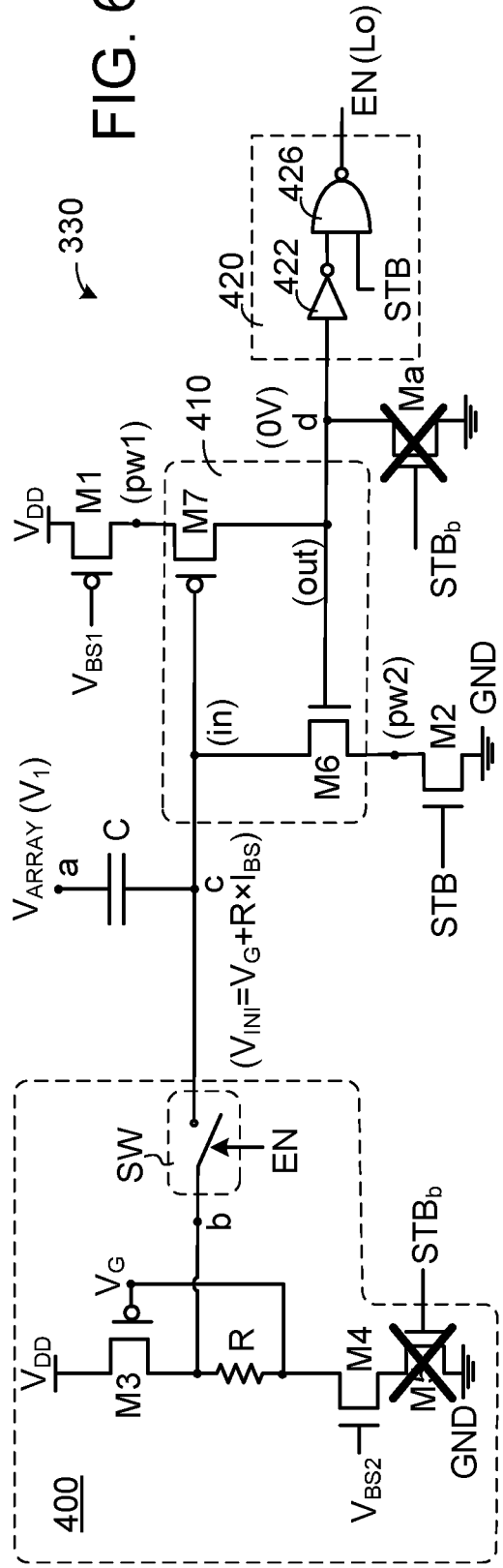
FIG. 6A
FIG. 6B

NON-VOLATILE MEMORY AND VOLTAGE DETECTING CIRCUIT THEREOF

This application claims the benefit of U.S. provisional application Ser. No. 63/298,202, filed Jan. 10, 2022, the subject matter of which is incorporated herein by reference.

FIELD OF THE INVENTION

The present invention relates to a non-volatile memory and an internal circuit of the non-volatile memory, and more particularly to a non-volatile memory operable in an idle mode and a voltage detecting circuit of the non-volatile memory.

BACKGROUND OF THE INVENTION

As is well known, non-volatile memories have been widely used in a variety of electronic products. When the non-volatile memory is used in a low power electronic device, the non-volatile memory can be operated in an idle mode to reduce the power consumption.

FIG. 1 is a schematic circuit block diagram illustrating the architecture of a conventional non-volatile memory for an electronic device. The non-volatile memory 100 comprises a memory module 120, a processing unit 112 and a power supply unit 114. The memory module 120 comprises a driving circuit 122 and a memory array 124.

The non-volatile memory 100 is connected with a host 180. In addition, the non-volatile memory 100 receives a supply voltage $V_{DD}$. For example, the supply voltage $V_{DD}$ is provided by a battery of the electronic device (not shown). By receiving the supply voltage $V_{DD}$, the non-volatile memory 100 is enabled.

The processing unit 112 is connected with the host 180 and the memory module 120. When the non-voltage memory 120 is in a normal mode, the processing unit 112 can receive an access command from the host 180. Moreover, the processing unit 112 generates a control signal Ctrl to access the data in the memory module 120.

By the power supply unit 114, the supply voltage $V_{DD}$ is converted into an array voltage $V_{ARRAY}$. The array voltage $V_{ARRAY}$ is transmitted to the driving circuit 122 of the memory module 120. For example, the driving circuit 122 comprises at least one word line driver. The word line driver receives the array voltage $V_{ARRAY}$. The word line driver is connected with plural word lines WL1~WLn of the memory array 124.

When the processing unit 112 accesses the data in the memory module 120, the array voltage $V_{ARRAY}$ is converted into a word line voltage by the word line driver. Moreover, a specified word line of the plural word lines WL1~WLn of the memory array 124 is driven by the word line driver according to the control signal Ctrl.

After the non-volatile memory 100 has not been accessed by the host 180 for a certain time period, the non-volatile memory 100 is switched to an idle mode. In the idle mode, the processing unit 112 asserts a standby signal STB and maintains the operation of a small portion of the internal circuit. In response to the standby signal STB, the power supply unit 114 is disabled. Consequently, the power supply unit 114 stops generating the array voltage $V_{ARRAY}$, and the memory module 120 is disabled.

When the host 180 accesses the non-volatile memory 100 again, the non-volatile memory 100 is switched from the idle mode into the normal mode again. Meanwhile, the processing unit 112 deasserts the standby signal STB, and the power supply unit 114 is started up again to generate the array voltage $V_{ARRAY}$.

However, the start-up time of the power supply unit 114 is usually too long. Consequently, during the start-up process, the array voltage $V_{ARRAY}$ is not ready. In other words, the driving circuit 122 has not received the array voltage $V_{ARRAY}$ to drive the word line quickly. When the non-volatile memory 100 is switched from the idle mode to the normal mode, the power supply unit 114 cannot provide the array $V_{ARRAY}$ immediately. Under this circumstance, the accessing performance of the non-volatile memory 100 is deteriorated.

As mentioned above, in the early stage of the start-up process that the non-volatile memory 100 is switched from the idle mode to the normal mode, the processing unit 122 cannot access the memory module 120 immediately. For solving the above drawbacks, a power supply unit 114 with a short start-up time is installed in the conventional non-volatile memory 100. Due to the short start-up time, the array voltage $V_{ARRAY}$ can be ready more quickly.

However, the power supply unit 114 with the short start-up time at least comprises a bandgap reference circuit, a voltage regulator and a charge pump. For shortening the start-up time of the power supply unit 114, the size of the charge pump needs to be very large. In other words, the charge pump occupies a large layout area of the power supply unit 114.

FIG. 2 is a schematic circuit block diagram illustrating the architecture of another conventional non-volatile memory. In comparison with the non-volatile memory 100 as shown in FIG. 1, the non-volatile memory 200 further comprises an auxiliary power supply unit 210.

The auxiliary power supply unit 210 receives the supply voltage $V_{DD}$ and the standby signal STB and generates the array voltage $V_{ARRAY}$. In the normal mode, the standby signal STB is not asserted, and the auxiliary power supply unit 210 is disabled. Under this circumstance, the array voltage $V_{ARRAY}$ is generated by the power supply unit 114. In the idle mode, the standby signal STB is asserted, and the power supply unit 114 is disabled. Under this circumstance, the auxiliary power supply unit 210 is enabled to generate the array voltage $V_{ARRAY}$.

As mentioned above, regardless of whether the non-volatile memory 200 is in the idle mode or the normal mode, the memory module 120 of the non-volatile memory 200 can receive the array voltage $V_{ARRAY}$. In other words, when the non-volatile memory 200 is switched from the idle mode to the normal mode, the memory module 120 has received the array voltage $V_{ARRAY}$. Consequently, the processing unit 112 can access the memory module 120 immediately.

However, the arrangement of the auxiliary power supply unit 210 in the non-volatile memory 200 also increases the layout area and generates additional power consumption.

SUMMARY OF THE INVENTION

An embodiment of the present invention provides a non-volatile memory. The non-volatile memory includes a processing unit, a power supply unit, a voltage detecting circuit and a memory module. The processing unit generates a standby signal. The power supply unit is connected with a first node. The power supply unit receives the standby signal. When the standby signal is not asserted, a supply voltage is converted into an array voltage with a first value by the power supply unit, and the array voltage is provided to the first node. When the standby signal is asserted, the power supply unit stops generating the array voltage. The voltage detecting circuit is connected with the first node. The voltage detecting circuit receives the standby signal. When the standby signal is asserted, the voltage detecting circuit detects the array voltage at the first node. The memory module is connected with the first node. The memory module receives the array voltage. When the array voltage decreases and reaches a second value, the voltage detecting circuit asserts an enable signal to enable the processing unit, and the processing unit deasserts the standby signal. When the array voltage increases and reaches the first value, the processing unit asserts the standby signal, and the voltage detecting circuit deasserts the enable signal.

Another embodiment of the present invention provides a voltage detecting circuit for a non-volatile memory. The non-volatile memory includes a power supply unit. The power supply unit is connected with a first node. The power supply unit provides an array voltage with a first value to the first node when a standby signal is not asserted. The power supply unit stops providing the array voltage when the standby signal is asserted. The voltage detecting circuit includes an initial voltage generator, a capacitor, a latch and a combinational logic circuit. The initial voltage generator receives an inverted standby signal and an enable signal. An output terminal of the initial voltage generator is connected with a second node. A first terminal of the capacitor is coupled to the first node. A second terminal of the capacitor is coupled to the second node. An input terminal of the latch is connected with the second node. An output terminal of the latch is connected with a third node. A first power terminal of the latch is coupled to a supply voltage. A second power terminal of the latch is coupled to a ground voltage. An input terminal of the combinational logic circuit is connected with the third node. An output terminal of the combinational logic circuit generates the enable signal.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 6A is a schematic circuit diagram illustrating the operations of the voltage detecting circuit during the charging period;

FIG. 6B is a schematic circuit diagram illustrating the operations of the voltage detecting circuit during the early stage of the detecting period;

DETAILED DESCRIPTION OF PREFERRED EMBODIMENTS

Figure 1:
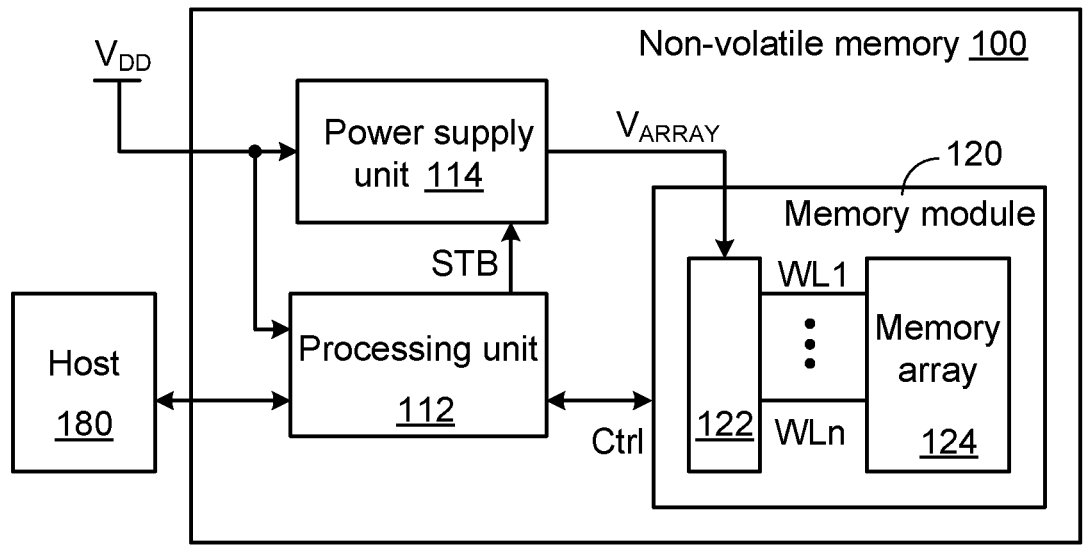
FIG. 1 (prior art) is a schematic circuit block diagram illustrating the architecture of a conventional non-volatile memory for an electronic device.
Figure 2:
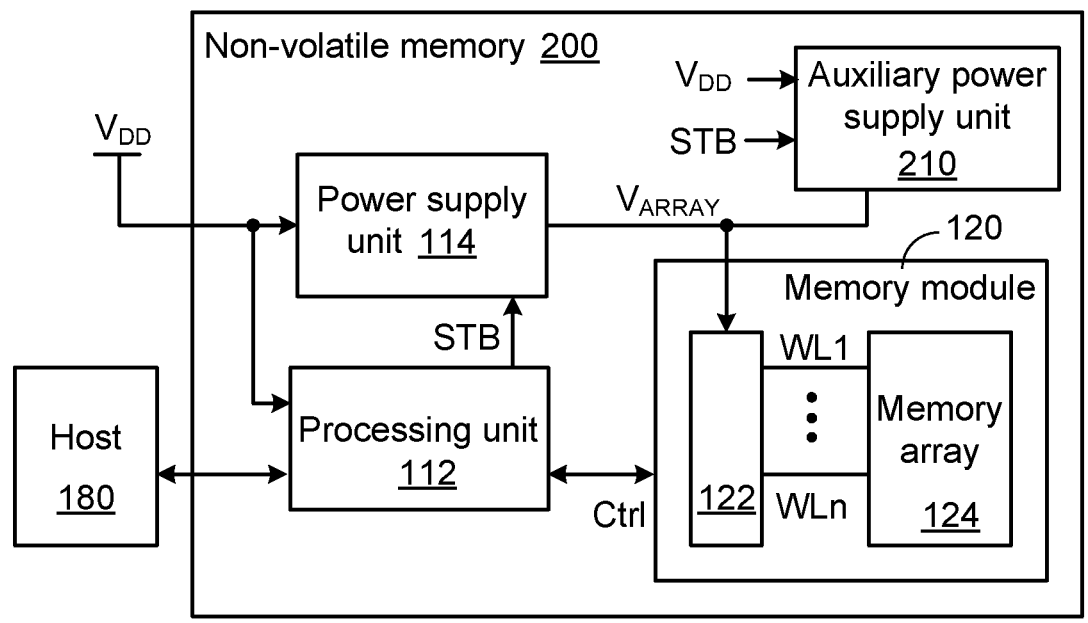
FIG. 2 (prior art) is a schematic circuit block diagram illustrating the architecture of another conventional non-volatile memory.
Figure 3A:
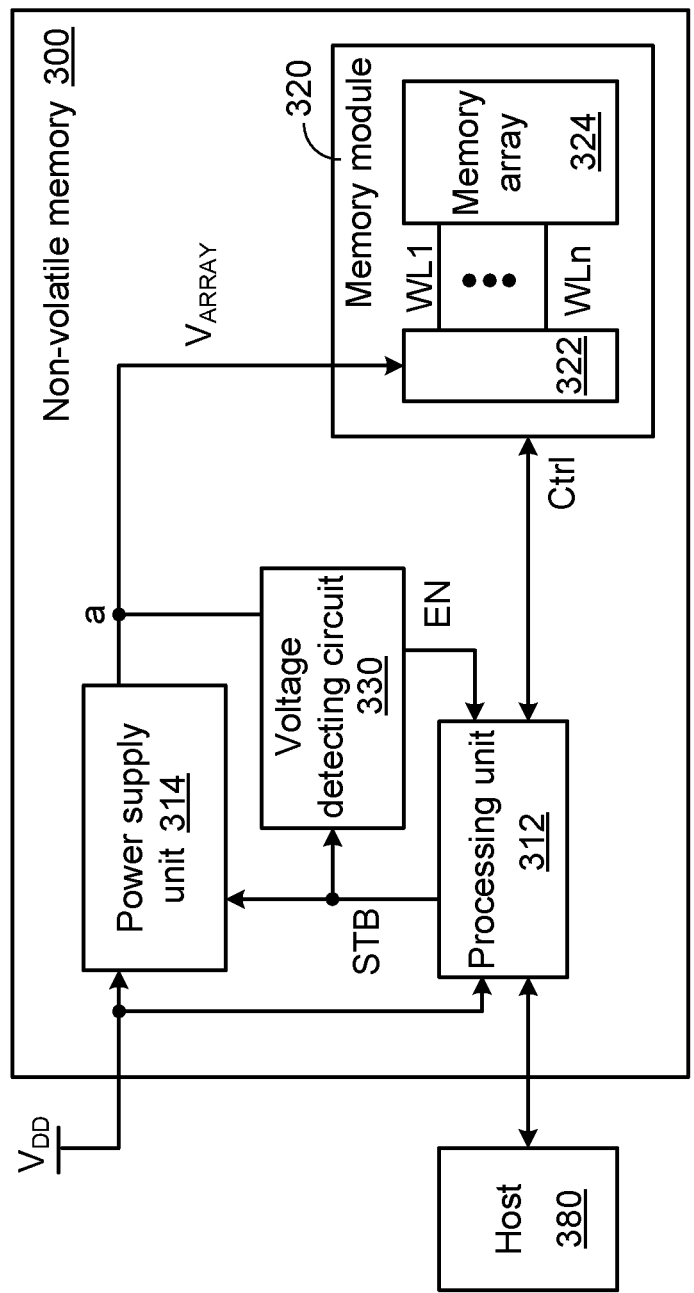
FIG. 3A is a schematic circuit block diagram illustrating the architecture of a non-volatile memory according to an embodiment of the present invention.
Figure 3B:
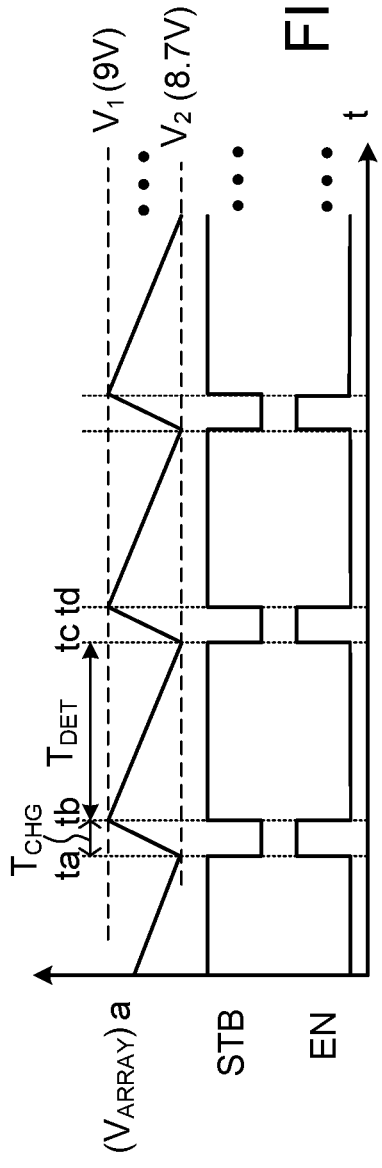
FIG. 3B is a schematic timing waveform diagram illustrating associated signals of the non-volatile memory according to the embodiment of the present invention.

FIG. 3A is a schematic circuit block diagram illustrating the architecture of a non-volatile memory according to an embodiment of the present invention. FIG. 3B is a schematic timing waveform diagram illustrating associated signals of the non-volatile memory according to the embodiment of the present invention. The non-volatile memory 300 is connected with a host 380. The host 380 can generate an access command to the non-volatile memory 300 to access the data in the non-volatile memory 300. The operations of the host 380 to access the non-volatile memory 300 are well known in the art, and not redundantly described herein.

The non-volatile memory 300 comprises a memory module 320, a process unit 312, a power supply unit 314 and a voltage detecting circuit 330. The memory module 320 comprises a driving circuit 322 and a memory array 324. The non-volatile memory 300 receives a supply voltage $V_{DD}$. For example, the supply voltage $V_{DD}$ is provided by a battery of an electronic device (not shown). By receiving the supply voltage $V_{DD}$, the non-volatile memory 300 is enabled.

By the power supply unit 314, the supply voltage $V_{DD}$ is converted into an array voltage $V_{ARRAY}$. The output terminal of the power supply unit 314 is connected with a node a. For example, the supply voltage $V_{DD}$ (e.g., 3.3V) is converted into the array voltage $V_{ARRAY}$ (e.g., 9V) by the power supply unit 314.

The driving circuit 322 of the memory module 320 is connected with the node a. Consequently, the array voltage $V_{ARRAY}$ can be transmitted to the driving circuit 322 of the memory module 320. For example, the driving circuit 322 comprises at least one word line driver (not shown). The word line driver receives the array voltage $V_{ARRAY}$. The word line driver is connected with plural word lines WL1~WLn of the memory array 324.

When the non-volatile memory 300 is in a normal mode, the processing unit 312 can generate a control signal Ctrl to access the data in the memory module 320. When the processing unit 312 accesses the data in the memory module 320, the array voltage $V_{ARRAY}$ is converted into a word line voltage by the word line driver. Moreover, a specified word line of the plural word lines WL1~WLn of the memory array 324 is driven by the word line driver according to the control signal Ctrl.

When the non-volatile memory 300 is in the idle mode, the processing unit 312 is switched to a standby state to assert a standby signal STB. Under this circumstance, only a small portion of the internal circuit of the processing unit 312 is enabled. In response to the standby signal STB, the power supply unit 314 is disabled. Consequently, the power supply unit 314 stops generating the array voltage $V_{ARRAY}$. In other words, when the standby signal STB is asserted, the array voltage $V_{ARRAY}$ at the node a gradually decreases because the power supply unit 314 stops generating the array voltage $V_{ARRAY}$.

In an embodiment, the voltage detecting circuit 330 is connected with the node a. Moreover, the voltage detecting circuit 330 receives the standby signal STB. When the standby signal STB is asserted, it means that the processing unit 312 is switched into the standby state. Meanwhile, the voltage detecting circuit 330 starts to detect the array voltage $V_{ARRAY}$ at the node a. When the standby signal STB is not asserted, it means that the processing unit 312 is no longer in the standby state. Consequently, the voltage detecting circuit 330 does not detect the array voltage $V_{ARRAY}$ at the node a.

Please refer to FIG. 3B. When the non-volatile memory 300 is in the idle mode, the magnitude of the array voltage $V_{ARRAY}$ at the node a is changed between a first value $V_1$ and a second value $V_2$. That is, the first value $V_1$ is the maximum value of the array voltage $V_{ARRAY}$, and the second value $V_2$ is the minimum value of the array voltage $V_{ARRAY}$. The first value is a stable value of the array voltage $V_{ARRAY}$ that is generated by the power supply unit 314. The second value is a low threshold value of the array voltage $V_{ARRAY}$. For example, the stable value of the array voltage $V_{ARRAY}$ is 9V, and the low threshold value of the array voltage $V_{ARRAY}$ is 8.7V. That is, the first value $V_1$ is 9V, and the second value $V_2$ is 8.7V.

At the time point ta, the array voltage $V_{ARRAY}$ decreases and reaches the second value $V_2$. Meanwhile, the voltage detecting circuit 330 asserts an enable signal EN. Moreover, the enable signal EN is switched to a logic high level state to enable the processing unit 312. Consequently, the processing unit 312 is enabled, and the processing unit 312 is not in the standby state. Meanwhile, the processing unit 312 deasserts the standby signal STB, and the standby signal STB is switched to a logic low level state.

In the time period between the time point to and the time point tb (i.e., a charging period $T_{CHG}$), the processing unit 312 is not in the standby state. Meanwhile, the standby signal STB is maintained in the logic low level state, and the enable signal EN is maintained in the logic high level state. Since the standby signal STB is in the logic low level state, the power supply unit 314 is enabled to charge the node a. Consequently, the array voltage $V_{ARRAY}$ at the node a gradually increases from the second value $V_2$ (i.e., the minimum) to the first value $V_1$ (i.e., the maximum).

At the time point tb, the array voltage $V_{ARRAY}$ increases and reaches the first value $V_1$, and the processing unit 312 is switched to the standby state again. Meanwhile, the processing unit 312 asserts the standby signal STB, and the standby signal STB is switched to the logic high level state. Consequently, the power supply unit 314 is disabled. In addition, the voltage detecting circuit 330 deasserts the enable signal EN. Consequently, the enable signal EN is switched to the logic low level state, and the voltage detecting circuit 330 starts to detect the array voltage $V_{ARRAY}$ at the node a.

In the time period between the time point tb and the time point tc (i.e., a detecting period $T_{DET}$), the standby signal STB is maintained in the logic high level state, and the enable signal EN is maintained in the logic low level state. Consequently, the array voltage $V_{ARRAY}$ gradually decreases from the first value $V_1$ (i.e., the maximum) to the second value $V_2$ (i.e., the minimum). In other words, during the detecting period $T_{DET}$, the voltage detecting circuit 330 continuously detects the array voltage $V_{ARRAY}$ at the node a.

At the time point tc, the array voltage $V_{ARRAY}$ decreases to the second voltage $V_2$. Meanwhile, the voltage detecting circuit 330 asserts the enable signal EN. Moreover, the enable signal EN is switched to the logic high level state to enable the processing unit 312. Consequently, the processing unit 312 deasserts the standby signal STB. Meanwhile, the standby signal STB is switched to the logic low level state, and the processing unit 312 is not in the standby state. The time period between the time point tc and the time point td is another charging period. During the charging period between the time point tc and the time point td, the array voltage $V_{ARRAY}$ increases to the first value $V_1$ again.

As mentioned above, the voltage detecting circuit 330 detects the magnitude of the array voltage $V_{ARRAY}$ at the output terminal of the power supply unit 314 when the non-volatile memory 300 is in the idle mode. During the detecting period $T_{DET}$, if the array voltage $V_{ARRAY}$ decreases to the second value $V_2$, the voltage detecting circuit 330 asserts the enable signal EN. Consequently, the processing unit 312 is not in the standby state, and the processing unit 312 is operated in the charging period $T_{CHG}$. During the charging period $T_{CHG}$, the power supply unit 314 generates the array voltage $V_{ARRAY}$. Consequently, the magnitude of the array voltage $V_{ARRAY}$ gradually increases from the second value $V_2$ to the first value $V_1$. Then, the processing unit 312 is in the standby state again, and the processing unit 312 is operated in another detecting period.

In other words, when the non-volatile memory 300 is in the idle mode, the voltage detecting circuit 330 detects the magnitude of the array voltage $V_{ARRAY}$. Moreover, the array voltage $V_{ARRAY}$ is controlled to be maintained in a specified range. When the non-volatile memory 300 is switched from the idle mode to the normal mode, the memory module 320 has received the array voltage $V_{ARRAY}$. Consequently, the processing unit 312 can access the data in the memory module 320 immediately. Under this circumstance, the accessing performance of the non-volatile memory 300 is largely enhanced.

During the charging period $T_{CHG}$, the processing unit 312 is not in the standby state. After the processing unit 312 confirms that the array voltage $V_{ARRAY}$ increases to the first value $V_1$, the processing unit 312 is switched to the standby state again. In an embodiment, the processing unit 312 receives the array voltage $V_{ARRAY}$ directly. Moreover, the processing unit 312 judges whether the array voltage $V_{ARRAY}$ reaches the first value $V_1$. When the array voltage $V_{ARRAY}$ reaches the first value $V_1$, the processing unit 312 asserts the standby signal STB, and the processing unit 312 is switched into the standby state.

Alternatively, the processing unit 312 judges whether the array voltage $V_{ARRAY}$ reaches the first value $V_1$ according to the start-up time of the power supply unit 314. For example, the start-up time of the power supply unit 314 is 1.5 μs. After the power supply unit 314 has been started up for 1.5 μs, the magnitude of the array voltage $V_{ARRAY}$ can reach the stable first value $V_1$. Consequently, after the enable signal EN has been asserted by the processing unit 312 for a time period longer than 1.5 μs (e.g., 2.0 μs,), the processing unit 312 asserts the standby signal STB, and the processing unit 312 is switched into the standby state.

It is noted that the method for the processing unit 312 to judge whether the array voltage $V_{ARRAY}$ reaches the first value $V_1$ is not restricted. Similarly, when the array voltage $V_{ARRAY}$ reaches the first value $V_1$, the processing unit 312 asserts the standby signal STB, and the processing unit 312 is switched into the standby state.

In the above embodiment, the standby signal STB is switched from the logic low level state to the logic high level state when the standby signal STB is asserted by the processing unit 312, and the standby signal STB is switched from the logic high level state to the logic low level state when the standby signal STB is not asserted by the processing unit 312. It is noted that the definitions of the logic level states of the standby signal STB are not restricted. Similarly, the definitions of the logic level states of the enable signal EN are not restricted. That is, the logic level states of the standby signal STB and the logic level states of the enable signal EN may be defined according to the practical requirements.

The magnitudes of the array voltage $V_{ARRAY}$, the first value $V_1$ and the second value $V_2$ are not restricted. The power supply unit 314 may be designed according to the characteristics of the memory array 324 in the memory module 320. For example, the array voltage $V_{ARRAY}$ of 12V is provided to the driving circuit 322. Moreover, the first value $V_1$ is 12V, and the second value $V_2$ is 11.5V.

Figure 4A:
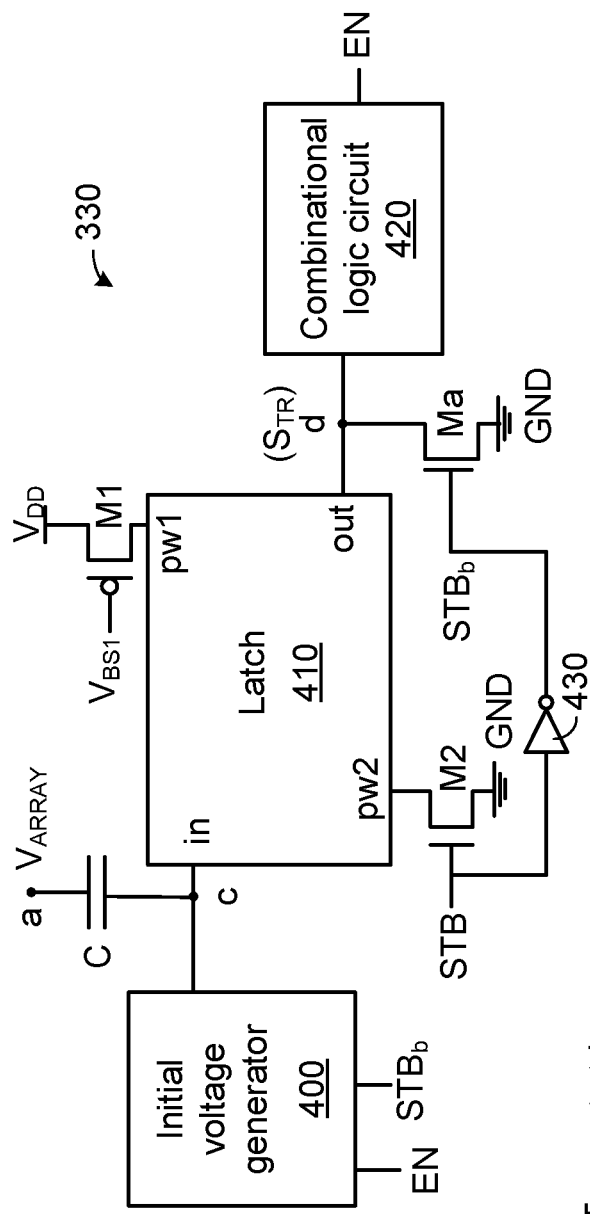
FIG. 4A is a schematic circuit diagram illustrating the circuitry structure of the voltage detecting circuit in the non-volatile memory according to the embodiment of the present invention.

FIG. 4A is a schematic circuit diagram illustrating the circuitry structure of the voltage detecting circuit in the non-volatile memory according to the embodiment of the present invention. The voltage detecting circuit 330 comprises a NOT gate 430, an initial voltage generator 400, a latch 410, a capacitor C, a transistor M1, a transistor M2, a transistor Ma and a combinational logic circuit 420. In an embodiment, the transistor M1 is a P-type transistor, and the transistor M2 and the transistor Ma are N-type transistors.

The input terminal of the NOT gate 430 receives the standby signal STB. The output terminal of the NOT gate 430 generates an inverted standby signal $STB_b$. In another embodiment, the NOT gate 430 is included in the processing unit 312. Consequently, the standby signal STB and the inverted standby signal $STB_b$ in the complementary relationship are generated by the processing unit 312 and transmitted to the voltage detecting circuit 330.

The two input terminals of the initial voltage generator 400 receive the enable signal EN and the inverted standby signal $STB_b$, respectively. The output terminal of the initial voltage generator 400 is connected with a node c. The initial voltage generator is configured to generate the initial voltage $V_{INI}$ according to the enable signal EN and the inverted standby signal $STB_b$. During the charging period $T_{CHG}$, the initial voltage generator 400 is enabled according to the enable signal EN and the inverted standby signal $STB_b$. Consequently, a voltage at the node c is an initial voltage $V_{INI}$. Moreover, during the detecting period $T_{DET}$, the initial voltage generator 400 is disabled according to the enable signal EN and the inverted standby signal $STB_b$. Consequently, the voltage at the node c starts to decrease from the initial voltage $V_{INI}$.

The first terminal of the capacitor C is coupled to the node a to receive the array voltage $V_{ARRAY}$. The second terminal of the capacitor C is coupled to the node c.

The input terminal in of the latch 410 is connected with the node c. The output terminal out of the latch 410 is connected with a node d. The first power terminal pw1 of the latch 410 is coupled to the supply voltage $V_{DD}$ through the transistor M1. The second power terminal pw2 of the latch 410 is coupled to a ground terminal GND through the transistor M2. The output terminal out of the latch 410 is coupled to the ground terminal GND through the transistor Ma.

The source terminal of the transistor M1 receives the supply voltage $V_{DD}$. The gate terminal of the transistor M1 receives a bias voltage $V_{BS1}$ so the transistor M1 can be kept in a turned on state. The drain terminal of the transistor M1 is connected with the first power terminal pw1 of the latch 410. The drain terminal of the transistor M2 is connected with the second power terminal pw2 of the latch 410. The gate terminal of the transistor M2 receives the standby signal STB. The source terminal of the transistor M2 is connected with the ground terminal GND. The drain terminal of the transistor Ma is connected with the output terminal out of the latch 410. The gate terminal of the transistor Ma receives the inverted standby signal $STB_b$. The source terminal of the transistor Ma is connected with the ground terminal GND. In another embodiment, the first power terminal pw1 of the latch 410 may directly receive supply voltage $V_{DD}$ instead of passing through the transistor M1.

During the charging period $T_{CHG}$, the transistor M2 is turned off, and the latch 410 is disabled, and the transistor Ma is turned on. Consequently, the output terminal out of the latch 410 (i.e. the node d) is reset to the ground voltage (0V).

During the detecting period $T_{DET}$, the transistor M2 is turned on and the transistor Ma is turned off, and the latch 410 is enabled. According to the change of the voltage at the input terminal in of the latch 410, a trigger signal $S_{TR}$ is generated from the output terminal out of the latch 410.

The input terminal of the combinational logic circuit 410 is connected with the node d. The output terminal of the combinational logic circuit 410 generates the enable signal EN.

During the charging period $T_{CHG}$, the initial voltage generator 400 is enabled, and the latch 410 is disabled. During the detecting period $T_{DET}$, the initial voltage generator 400 is disabled, and the latch 410 is enabled.

Figure 4B:
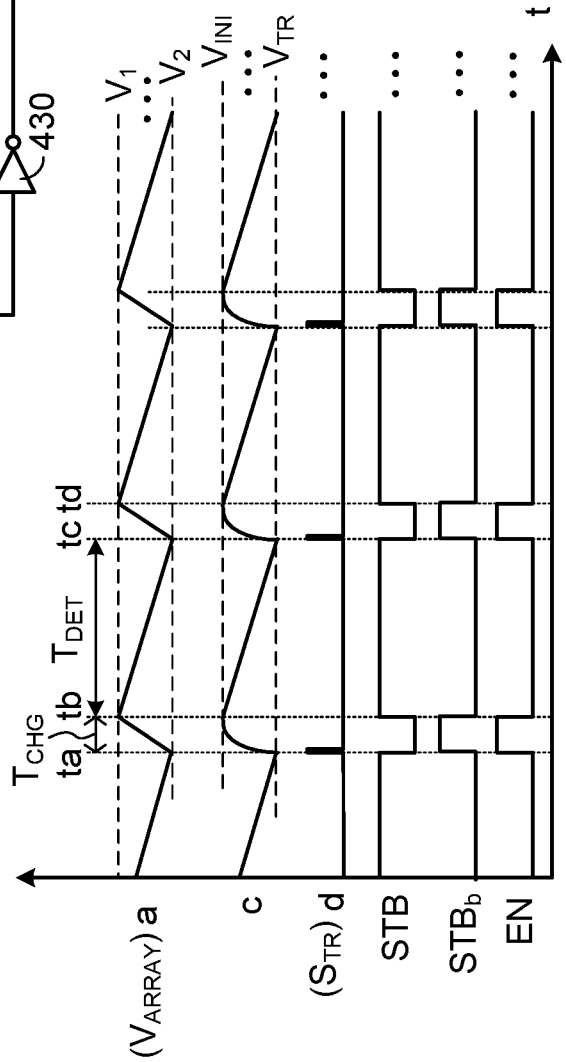
FIG. 4B is a schematic timing waveform diagram illustrating associated signals of the voltage detecting circuit as shown in FIG. 4A.

FIG. 4B is a schematic timing waveform diagram illustrating associated signals of the voltage detecting circuit as shown in FIG. 4A. In comparison with the timing waveform diagram as shown in FIG. 3B, the timing waveform diagram as shown in FIG. 4B further comprises the signals at the node c and the node d. Please refer to FIG. 4B. During the charging period $T_{CHG}$ between the time point to and the time point tb, the enable signal EN is in the logic high level state, and the standby signal STB is in the logic low level state. Consequently, the voltage at the node c is charged to the initial voltage $V_{INI}$. Moreover, the array voltage $V_{ARRAY}$ at the node a increases to the first value $V_1$.

During the detecting period $T_{DET}$ between the time point tb and the time point tc, the enable signal EN is in the logic low level state, and the standby signal STB is in the logic high level state. Consequently, the voltage at the node c starts to decrease from the initial voltage $V_{INI}$. Since the capacitor C is coupled between the node a and the node c, the voltage at the node a and the voltage at the node c have the same falling rate during the detecting period $T_{DET}$.

At the time point tc, the array voltage $V_{ARRAY}$ decreases to a voltage level equal to or lower than a second value $V_2$, and the voltage at the node c (i.e., the input terminal in of the latch 410) decreases to a voltage level equal to or lower than a trigger voltage $V_{TR}$. Meanwhile, the latch 410 is triggered, and the state of the output terminal out (i.e., the node d) of the latch 410 is changed. Consequently, the trigger signal $S_{TR}$ is asserted. In response to the trigger signal $S_{TR}$, the combinational logic circuit 420 asserts the enable signal EN. That is to say, when the array voltage $V_{ARRAY}$ is equal to or lower than the second value $V_2$, the trigger signal $S_{TR}$ is asserted. Also, when the array voltage $V_{ARRAY}$ reaches the second value $V_2$, the combinational logic circuit 420 asserts the enable signal EN according to the trigger signal $S_{TR}$ and the detecting period $T_{DET}$ is ended.

Figure 5:
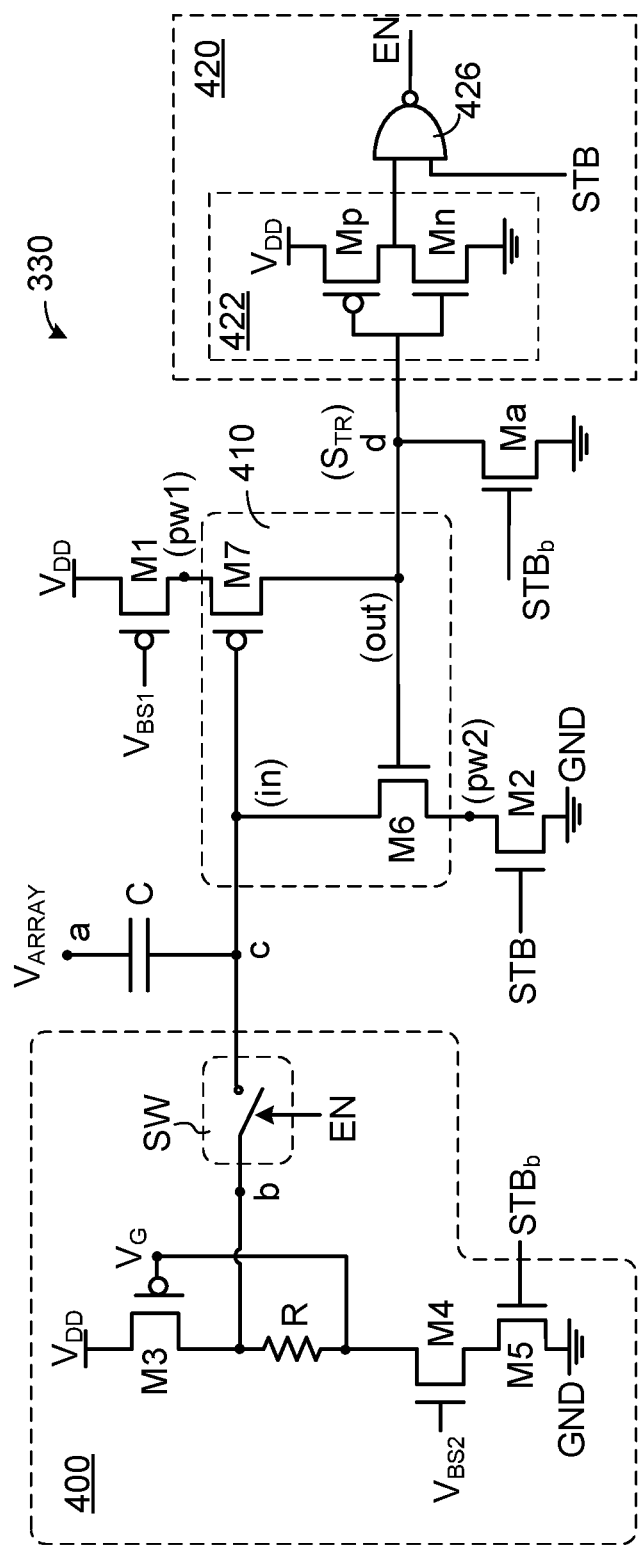
FIG. 5 is a schematic circuit diagram illustrating the detailed circuitry structure and associated voltage signals of the voltage detecting circuit according to the embodiment of the present invention.

FIG. 5 is a schematic circuit diagram illustrating the detailed circuitry structure according to the embodiment of the present invention. The initial voltage generator 400 comprises a switch SW, a transistor M3, a transistor M4, a transistor M5 and a resistor R. In an embodiment, the transistor M3 is a P-type transistor, and the transistor M4 and the transistor M5 are N-type transistors.

The first terminal of the switch SW is connected with the node b. The second terminal of the switch SW is the output terminal of the initial voltage generator 400. In addition, the second terminal of the switch SW is connected with the node c. The control terminal of the switch SW receives the enable signal EN. During the charging period $T_{CHG}$, the switch SW is in a closed state according to the enable signal EN, and the voltage with the initial voltage $V_{INI}$ is transmitted from the node b to the node c. During the detecting period $T_{DET}$, the switch SW is in an open state according to the enable signal EN, and the node c stops receiving the voltage with the initial voltage $V_{INI}$ from the output terminal of the initial voltage generator 400.

The source terminal of the transistor M3 receives the supply voltage $V_{DD}$. The drain terminal of the transistor M3 is connected with the node b. The first terminal of the resistor R is connected with the node b. The second terminal of the resistor R is connected with the gate terminal of the transistor M3. The drain terminal of the transistor M4 is connected with the second terminal of the resistor R. The gate terminal of the transistor M4 receives a bias voltage $V_{BS2}$. The drain terminal of the transistor M5 is connected with the source terminal of the transistor M4. The source terminal of the transistor M5 is connected with the ground terminal GND. The gate terminal of the transistor M5 is the input terminal of the initial voltage generator 400. In addition, the gate terminal of the transistor M5 receives the inverted standby signal $STB_b$.

The latch 410 comprises a transistor M6 and a transistor M7. In an embodiment, the transistor M7 is a P-type transistor, and the transistor M6 is an N-type transistor. The drain terminal of the transistor M6 is the input terminal in of the latch 410. The drain terminal of the transistor M7 is the output terminal out of the latch 410.

The drain terminal of the transistor M6 is connected with the node c. The gate terminal of the transistor M6 is connected with the node d. The source terminal of the transistor M6 is the second power terminal pw2 of the latch 410. Moreover, the source terminal of the transistor M7 is the first power terminal pw1 of the latch 410. The gate terminal of the transistor M7 is connected with the node c. The drain terminal of the transistor M7 is connected with the node d.

The combinational logic circuit 420 is configured to generate the enable signal EN according to the trigger signal $S_{TR}$ and the standby signal STB. The combinational comprises a NOT gate 422 and a NAND gate 426. The input terminal of the NOT gate 422 is connected with the node d. The output terminal of the NOT gate 422 is connected with the first input terminal of the NAND gate 426. The second input terminal of the NAND gate 426 receives the standby signal STB. The output terminal of the NAND gate 426 generates the enable signal EN.

The NOT gate 422 further includes a transistor Mp and a transistor Mn. A gate terminal of the transistor Mp and a gate terminal of the transistor Mn are connected with the node d. A drain terminal of the transistor Mp and a drain terminal of the transistor Mn are connected with the first input terminal of the NAND gate 426. A source terminal of the transistor Mp receives the supply voltage $V_{DD}$. A source terminal of the transistor Mn is connected with the ground terminal GND. According to the embodiment of the present invention, a threshold voltage of the transistor Mn is greater than a threshold voltage of the transistor M6.

In the above embodiment, the combinational logic circuit 420 is designed according to the logic levels of the enable signal EN and the standby signal STB. It is noted that the combinational logic circuit 420 is not restricted to the circuitry structure of FIG. 5. That is, the circuitry structure of the combinational logic circuit 420 may be designed according to the practical requirements.

Figure 6C:
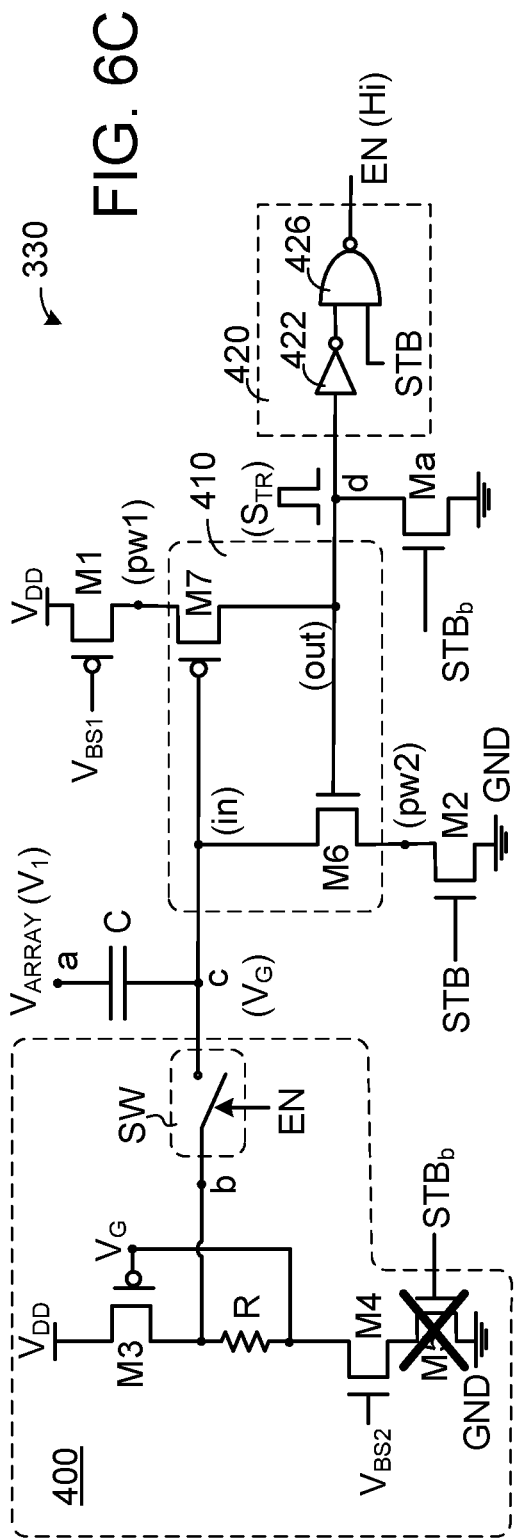
FIG. 6C is a schematic circuit diagram illustrating the operations of the voltage detecting circuit in the later stage of the detecting period.
Figure 6D:
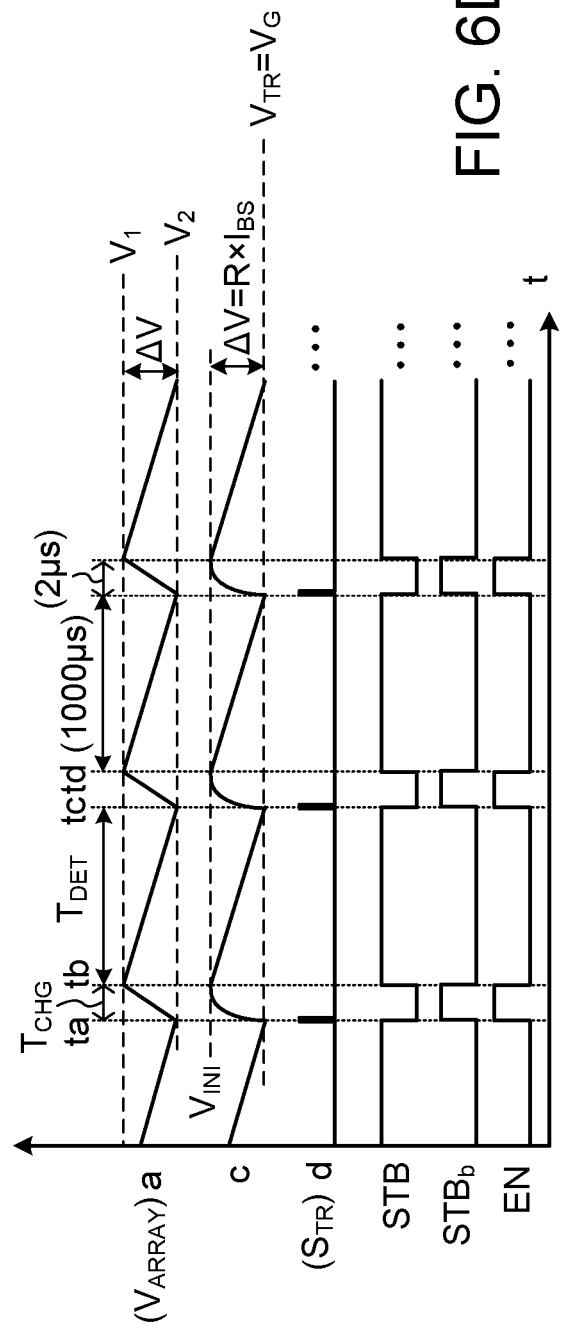
FIG. 6D is a schematic timing waveform diagram illustrating associated signals of the voltage detecting circuit as shown in FIG. 5.

FIG. 6A is a schematic circuit diagram illustrating the operations of the voltage detecting circuit during the charging period. FIG. 6B is a schematic circuit diagram illustrating the operations of the voltage detecting circuit during the early stage of the detecting period. FIG. 6C is a schematic circuit diagram illustrating the operations of the voltage detecting circuit in the later stage of the detecting period. FIG. 6D is a schematic timing waveform diagram illustrating associated signals of the voltage detecting circuit as shown in FIG. 5. For simplicity, in the FIGS. 6A, 6B and 6C, the NOT gate 422 is represented by its symbol rather than its circuit structure including transistors Mp and Mn.

Please refer to FIGS. 6A and 6D. In the charging period $T_{CHG}$ between the time point ta and the time point tb, the standby signal STB is in the logic low level state, the inverted standby signal $STB_b$ is in the logic high level state, and the enable signal EN is in the logic high level state. Moreover, the switch SW is in the closed state. Meanwhile, the transistor M2 is turned off, and the latch 410 is disabled. Moreover, the transistor Ma is turned on. Consequently, the voltage at the node d is reset to the ground voltage (0V). The combinational logic circuit 420 generates the enable signal EN in the logic high level state. Moreover, the initial voltage generator 400 is enabled. The operating principles of the initial voltage generator 400 will be described as follows.

Since the enable signal EN and the inverted standby signal $STB_b$ are in the logic high level state, the transistor M5 is turned on, and the initial voltage generator 400 is enabled. Meanwhile, the transistor M4 receives the bias voltage $V_{BS2}$ and generates a bias current $I_{BS}$. Moreover, the bias current $I_{BS}$ flows from the supply voltage $V_{DD}$ to the ground terminal GND through the transistor M3, the resistor R, the transistor M4 and the transistor M5.

When the transistor M3 is turned on, the voltage at the gate terminal of the transistor M3 is equal to ($V_{DD}-V_{THP}$). That is, $V_G=V_{DD}-V_{THP}$, wherein $V_{THP}$ is a threshold voltage of the transistor M3, and $V_G$ is an on voltage of the transistor M3. Moreover, the initial voltage $V_{INI}$ at the node b is equal to ($V_G+R\times I_{BS}$). During the charging period $T_{CHG}$, the switch SW is in the closed state. Consequently, at the time point tb, the node c is charged to the initial voltage $V_{INI}$. In addition, the array voltage $V_{ARRAY}$ at the node a is charged to the first value $V_1$.

As shown in FIGS. 6B and 6D, the time period between the time point tb and the time point tc is the detecting period $T_{DET}$. During the early stage of the detecting period $T_{DET}$ (i.e., at the time point tb), the standby signal STB is switched to the logic high level state, and the inverted standby signal $STB_b$ is switched to the logic low level state. Consequently, the enable signal EN is switched to the logic low level state by the combinational logic circuit 420. Meanwhile, the initial voltage generator 400 is disabled, the switch SW is in the open state, and the voltage at the node c is equal to the initial voltage $V_{INI}$. In addition, the transistor M2 is turned on, and the latch 410 is enabled. Moreover, the transistor Ma is turned off, and the voltage at the node d is the ground voltage (0V).

In other words, during the early stage of the detecting period $T_{DET}$ (i.e., at the time point tb), the array voltage $V_{ARRAY}$ at the node a is equal to the first value $V_1$, and the voltage at the node c is equal to the initial voltage $V_{INI}$. Moreover, the initial voltage $V_{INI}$ is equal to $(V_G+R\times I_{BS})$, i.e., $V_{INI}=(V_G+R\times I_{BS})$.

As shown in FIG. 6D, the time period between the time point tb and the time point tc is the detecting period $T_{DET}$. Meanwhile, the initial voltage generator 400 is disabled, the switch SW is in the open state, and the latch 410 is enabled. Consequently, the array voltage $V_{ARRAY}$ at the node a and the voltage at the node c gradually decrease at the same falling rate.

Please refer to FIGS. 6C and 6D. During the later stage of the detecting period $T_{DET}$ (i.e., at the time point tc), the array voltage $V_{ARRAY}$ at the node a decreases to the second value $V_2$, and the voltage at the node c decreases to $V_G$, wherein $V_G=V_{DD}-V_{THP}$. For example, in case that the transistor M3 and the transistor M7 have the same size, $V_G$ can be regarded as the on voltage of the transistor M7. That is, the trigger voltage $V_{TR}$ of the latch 410 is equal to the on voltage $V_G$ of the transistor M7.

In other words, at the time point tc, the voltage at the node c decreases to the trigger voltage $V_{TR}$ (i.e., $V_{TR}=V_G$). Meanwhile, the transistor M7 of the latch 410 is turned on, and the latch 410 is triggered. Consequently, the voltage at the node d (i.e. the trigger signal $S_{TR}$) is switched from the logic low level state to the logic high level state. Consequently, the combinational logic circuit 420 asserts the enable signal EN. The enable signal EN is switched from the logic low level state to the logic high level state. Then, in a short time, the processing unit 312 does not assert the standby signal STB. Then, the processing unit 312 is operated in the charging period $T_{CHG}$ again. Consequently, the transistor Ma is turned on, and the voltage at the node d is reset to the ground voltage (0V).

In some embodiments, when the voltage at the node c gradually decreases, the transistor M7 may start to be slightly turned on to pull high the voltage at the node d, and the transistor M6 with the lower threshold voltage may start to be slightly turned on to pull down the voltage at the node c. The operations mentioned above causes rapid voltage rise at node d, which avoid current leakage.

Also, as mentioned above, at the time point tc, the enable signal EN is asserted, and the standby signal STB is disabled. After the detecting period $T_{DET}$ is ended, the voltage detecting circuit 330 is operated in another charging period $T_{CHG}$. The operations of the voltage detecting circuit 330 in this detecting period are similar to those in the previous charging period, and not redundantly described herein.

As shown in FIG. 6D, the voltage at the node c decreases from the initial voltage $V_{INI}$ to the trigger voltage $V_{TR}$. Moreover, $V_{INI}=(V_G+R\times I_{BS})$, and $V_{TR}=V_G$. Consequently, the difference $\Delta V$ between the initial voltage $V_{INI}$ and the trigger voltage $V_{TR}$ is equal to $R\times I_{BS}$. Similarly, the difference $\Delta V$ between the first value $V_1$ of the array voltage $V_{ARRAY}$ is equal to $R\times I_{BS}$. In other words, the peak-to-peak value of the ripple of the array voltage $V_{ARRAY}$ can be determined according to the resistance of the resistor R of the initial voltage generator 400 and the magnitude of the bias current $I_{BS}$.

For example, the first value $V_1$ of the array voltage $V_{ARRAY}$ is 9V. If the product of the resistance of the resistor R of the initial voltage generator 400 and the magnitude of the bias current $I_{BS}$ is 0.3V, the second value $V_2$ is 8.7V.

As mentioned above, in case that the transistor M3 and the transistor M7 have the same size, the transistor M3 and the transistor M7 have the same on voltage $V_G$. Consequently, the trigger voltage $V_{TR}$ of the latch 410 is equal to the on voltage $V_G$. In some embodiments, the size of the transistor M3 and the size of the transistor M7 are different. Moreover, the on voltage of the transistor M7 is determined according to the size ratio between the transistor M3 and the transistor M7 and used as the trigger voltage $V_{TR}$ of the latch 410.

In an embodiment, when the non-volatile memory 300 is in the idle mode, the detecting period $T_{DET}$ is about 1000 μs, and the charging period $T_{CHG}$ is about 2 μs. Due to the voltage detecting circuit 330, the power supply unit 314 is temporarily enabled and the array voltage $V_{ARRAY}$ is continuously provided to the memory module when the non-volatile memory 300 is in the ideal mode.

Since the voltage detecting circuit 330 is composed by a few electronic components, the layout area is too small. In addition, the voltage detecting circuit 330 generates the current during the charging period $T_{CHG}$ only. In the time process excluding the charging period $T_{CHG}$, the voltage detecting circuit 330 does not generate the leakage current. Consequently, the power consumption of the non-volatile memory 300 is reduced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:
1. A non-volatile memory, comprising:
a processing unit generating a standby signal;
a power supply unit connected with a first node, and receiving the standby signal, wherein when the standby signal is not asserted, a supply voltage is converted into an array voltage with a first value by the power supply unit, and the array voltage is provided to the first node, wherein when the standby signal is asserted, the power supply unit stops generating the array voltage;
a voltage detecting circuit connected with the first node, and receiving the standby signal, wherein when the standby signal is asserted, the voltage detecting circuit detects the array voltage at the first node; and
a memory module connected with the first node, and receiving the array voltage,
wherein when the array voltage decreases and reaches a second value, the voltage detecting circuit asserts an enable signal to enable the processing unit, and the processing unit deasserts the standby signal,
wherein when the array voltage increases and reaches the first value, the processing unit asserts the standby signal, and the voltage detecting circuit deasserts the enable signal.
2. The non-volatile memory as claimed in claim 1, wherein the memory module comprises a driving circuit and a memory array, wherein the driving circuit comprises a word line driver, and the word line driver is connected with plural word lines of the memory array, wherein when the processing unit accesses the memory module, the array voltage is converted into a word line voltage by the word line driver, and a specified word line of the plural word lines of the memory array is driven by the word line driver.

3. The non-volatile memory as claimed in claim 1, wherein the voltage detecting circuit comprises:
   a NOT gate receiving the standby signal, and generating an inverted standby signal;
   an initial voltage generator configured to generate an initial voltage at a second node according to the inverted standby signal and the enable signal;
   a capacitor, wherein a first terminal of the capacitor is coupled to the first node, and a second terminal of the capacitor is coupled to the second node;
   a latch, connected between the second node and a third node, wherein during a detecting period, when the array voltage is equal to or lower than the second value, a trigger signal is asserted; and
   a combinational logic circuit configured to generate the enable signal according to the trigger signal and the standby signal.

4. The non-volatile memory as claimed in claim 3, wherein during a charging period, the standby signal is not asserted, the inverted standby signal is asserted, the enable signal is asserted, and the trigger signal is reset to a ground voltage.

5. The non-volatile memory as claimed in claim 4, wherein during the detecting period when the array voltage decreases from the first value, the standby signal is asserted, the inverted standby signal is not asserted, the enable signal is not asserted, the initial voltage generator is disabled, and the latch is enabled.

6. The non-volatile memory as claimed in claim 5, wherein when the array voltage reaches the second value, the combinational logic circuit asserts the enable signal according to the trigger signal and the detecting period is ended.

7. The non-volatile memory as claimed in claim 6, wherein during the detecting period, the array voltage and the voltage at the second node decreases by the same falling rate.

8. A voltage detecting circuit for a non-volatile memory, the non-volatile memory comprising a power supply unit, the power supply unit being connected with a first node, the power supply unit providing an array voltage with a first value to the first node when a standby signal is not asserted, the power supply unit stopping providing the array voltage when the standby signal is asserted, the voltage detecting circuit comprising:
   an initial voltage generator, wherein the initial voltage generator receives an inverted standby signal and an enable signal, and an output terminal of the initial voltage generator is connected with a second node;
   a capacitor, wherein a first terminal of the capacitor is coupled to the first node, and a second terminal of the capacitor is coupled to the second node;
   a latch, wherein an input terminal of the latch is connected with the second node, an output terminal of the latch is connected with a third node, a first power terminal of the latch is coupled to a supply voltage, a second power terminal of the latch is coupled to a ground voltage; and
   a combinational logic circuit, wherein an input terminal of the combinational logic circuit is connected with the third node, and an output terminal of the combinational logic circuit generates the enable signal.

9. The voltage detecting circuit as claimed in claim 8, wherein during a charging period, the standby signal is not asserted, the inverted standby signal is asserted, and the enable signal is asserted, so that the initial voltage generator generates an initial voltage to the second node and the output terminal of the latch is reset to a ground voltage.

10. The voltage detecting circuit as claimed in claim 9, wherein during a detecting period, the standby signal is asserted, the inverted standby signal is not asserted, the enable signal is not asserted, the initial voltage generator is disabled, and the latch is enabled, so that a voltage at the second node starts to decrease from the initial voltage and the array voltage at the first node starts to decrease from the first value.

11. The voltage detecting circuit as claimed in claim 10, wherein when the voltage at the second node decreases to a trigger voltage, the latch is triggered, and a trigger signal is asserted, so that the combinational logic circuit asserts the enable signal and the detecting period is ended.

12. The voltage detecting circuit as claimed in claim 11, wherein when the detecting period is ended, the array voltage at the first node decreases to a voltage level equal to or lower than a second value.

13. The voltage detecting circuit as claimed in claim 8, wherein the voltage detecting circuit further comprises a first transistor and a second transistor, wherein a source terminal of the first transistor receives the supply voltage, a gate terminal of the first transistor receives a first bias voltage, and a drain terminal of the first transistor is connected with the first power terminal of the latch, wherein a drain terminal of the second transistor is connected with the second power terminal of the latch, a gate terminal of the second transistor receives the standby signal, and a source terminal of the second transistor is connected with the ground terminal.

14. The voltage detecting circuit as claimed in claim 8, wherein the initial voltage generator comprises:
   a third transistor, wherein a source terminal of the third transistor receives the supply voltage, and a drain terminal of the third transistor is connected with a fourth node;
   a resistor, wherein a first terminal of the transistor is connected with the fourth node, and a second terminal of the resistor is connected with a gate terminal of the third transistor;
   a fourth transistor, wherein a drain terminal of the fourth transistor is connected with the second terminal of the resistor, and a gate terminal of the fourth transistor receives a second bias voltage;
   a fifth transistor, wherein a drain terminal of the fifth transistor is connected with the drain terminal of the fourth transistor, a gate terminal of the fifth transistor receives the inverted standby signal, and a source terminal of the fifth transistor is coupled to the ground voltage; and
   a switch, wherein a first terminal of the switch is connected with the fourth node, a second terminal of the switch is connected with the second node, and a control terminal of the switch receives the enable signal,
   wherein during a charging period, the standby signal is not asserted, the inverted standby signal is asserted, and the enable signal is asserted, so that the switch is in a closed state and the initial voltage generator generates the initial voltage to the second node,
   wherein during a detecting period, the standby signal is asserted, the inverted standby signal is not asserted, and the enable signal is not asserted, so that the switch is in an open state.

15. The voltage detecting circuit as claimed in claim 8, wherein the latch comprises:
   a sixth transistor, wherein a drain terminal of the sixth transistor is connected with the second node, a gate terminal of the sixth transistor is connected with the third node, and a source terminal of the sixth transistor is the second power terminal of the latch; and a seventh transistor, wherein a source terminal of the seventh transistor is the first power terminal of the latch, a gate terminal of the seventh transistor is connected with the second node, and a drain terminal of the seventh transistor is connected with the third node;

wherein during a charging period, a voltage at the second node is charged to the initial voltage, and the array voltage at the first node has the first value, wherein when the voltage at the second node decreases to a trigger voltage in a detecting period, the latch is triggered, and a trigger signal is asserted.

16. The voltage detecting circuit as claimed in claim 15, wherein the combinational logic circuit comprises:

a NOT gate, wherein an input terminal of the NOT gate is connected with the third node; and a NAND gate, wherein a first input terminal of the NAND gate is connected with an output terminal of the NOT gate, a second input terminal of the NAND gate receives the standby signal, and an output terminal of the NAND gate generates the enable signal, wherein when the latch generates the trigger signal, the combinational logic circuit asserts the enable signal.

17. The voltage detecting circuit as claimed in claim 16, wherein NOT gate comprises:

a eight transistor, wherein a source terminal of the eighth transistor receives the supply voltage, a gate terminal of the eighth transistor is connected with the third node, and a drain terminal of the eighth transistor is connected with the first input terminal of the NAND gate, and a ninth transistor, wherein a drain terminal of the ninth transistor is connected with the first input terminal of the NAND gate, a gate terminal of the ninth transistor is connected with the third node, and a source terminal of the ninth transistor receives the ground voltage, wherein a threshold voltage of the ninth transistor is greater than a threshold voltage of the sixth transistor.

18. The voltage detecting circuit as claimed in claim 8, further comprises:

a tenth transistor, wherein a drain terminal of the tenth transistor is connected with the third node, a gate terminal of the tenth transistor receives the inverted standby signal, and a source terminal of the tenth transistor is coupled to the ground voltage, wherein the tenth transistor is configured to reset the output terminal of the latch to a ground voltage when the inverted standby signal is asserted.

19. The voltage detecting circuit as claimed in claim 8, wherein the non-volatile memory further comprises a processing unit, and the processing unit receives the enable signal, wherein when the enable signal is asserted, the processing unit deasserts the standby signal, wherein when the array voltage at the first node is charged to the first value, the processing unit asserts the standby signal.

* * * * *